United States Patent [19]

Suntola et al.

[11] 4,413,022

[45] Nov. 1, 1983

[54] METHOD FOR PERFORMING GROWTH OF COMPOUND THIN FILMS

[75] Inventors: Tuomo S. Suntola; Arto J. Pakkala; Sven G. Lindfors, all of Espoo, Finland

[73] Assignee: Canon Kabushiki Kaisha, Tokyo, Japan

[21] Appl. No.: 50,606

[22] Filed: Jun. 21, 1979

[30] Foreign Application Priority Data

Feb. 28, 1979 [FI] Finland ............................... 790680

[51] Int. Cl.³ ..................... C23C 11/00; C23C 13/00
[52] U.S. Cl. .................... 427/255.2; 427/255; 427/255.3; 427/255.7; 427/419.1; 427/419.2; 427/419.3; 427/419.7
[58] Field of Search .............. 427/255.2, 255.4, 255.7, 427/419.1, 255, 248.1, 250, 251, 399, 419.2, 419.7, 419.3; 118/50, 719, 715, 725, 726, 733

[56] References Cited

U.S. PATENT DOCUMENTS

| | | | |
|---|---|---|---|
| 3,218,203 | 11/1965 | Ruehrwein | 427/255.2 |
| 3,224,913 | 12/1965 | Ruehrwein | 427/255.2 |
| 3,602,192 | 8/1971 | Grochowski et al. | 118/719 |
| 3,721,583 | 3/1973 | Blakeslee | 156/311 |
| 3,964,937 | 6/1976 | Post et al. | 427/255.7 |
| 4,015,558 | 4/1977 | Small et al. | 118/50 |
| 4,048,955 | 9/1977 | Anderson | 118/50 |
| 4,058,430 | 11/1977 | Suntola et al. | 427/255.2 |

*Primary Examiner*—Sadie L. Childs
*Attorney, Agent, or Firm*—Fitzpatrick, Cella, Harper & Scinto

[57] ABSTRACT

A method and an apparatus are provided for performing growth of compound thin films by alternately repeating separate surface reactions of the substances comprising the compound. A carrier gas affects a diffusion barrier between the surface reaction steps to be separated from each other. The gas phase diffusion barrier is also applied to separate the source regions of different reacting vapors both from each other and from the surface reaction zone.

5 Claims, 17 Drawing Figures

METHOD FOR PERFORMING GROWTH OF COMPOUND THIN FILMS

BACKGROUND OF THE INVENTION

The present invention provides a useful tool for performing the method for producing compound thin films presented in U.S. Pat. No. 4,058,430. According to that method, referred to as ALE (Atomic Layer Epitaxy), high quality compound thin films can be produced by subjecting the surface to be grown to successive reactive vapors which make the surface grow by a single atomic layer in each reaction step.

When compared to thin film deposition concepts of the prior art, the ALE demand for separated surface reactions of different reactive vapors gives rise to special requirements for the equipment and method of performing the ALE growth. In U.S. Pat. No. 4,058,430 these requirements were approached using classical vacuum deposition techniques by providing separate reaction regions or periods, separated from each other by a region or period of high vacuum condition. Due to leaks of the reactive vapors from the reaction regions, and due to residual vapors especially in the case of exchange surface reactions, difficulties are found in obtaining the high vacuum condition needed for the successful separation of the reaction steps. These problems take away from an advantage of the ALE invention, wherein the self-stabilizing growth rate property of the ALE-method is obtained by using quantities of reactive vapors which contain reactive atoms in excess to the amount needed for a full surface coverage in a single surface reaction step.

SUMMARY OF THE INVENTION

An object of this invention is to provide a method and apparatus which overcomes the above-described difficulties which arise from using vacuum deposition techniques in performing the ALE growth method. An essential feature of the present invention is the use of gas phase diffusion barriers in order to separate the single surface reaction steps. According to the present invention the diffusion barrier techniques are also used to perform valve actions to control the flow of reactive vapors from their sources to the surface reaction zone, and to separate the exhaust condensation zone from the reaction zone. Furthermore, the gas used in the formation of the diffusion barriers can be used as a carrier gas to transfer the reactive vapors from their sources to the surface reaction zone and to transfer the residual vapors from the surface reaction zone to the exhaust.

The use of inert gases as carrier gases or as protective gases is known in the prior art in several connections, as for example, in the field of gas chromatography, and in Chemical Vapor Deposition (CVD) methods which are widely used in the semiconductor industry. In general, it may be helpful to regard the present invention as shifting the performance of ALE-growth from a Molecular Beam Epitaxy-MBE-type process towards the techniques of CVD. The relation of the method and apparatus of the present invention to CVD techniques of the prior art is, however, comparable to the substantial differences between the performance of the ALE process according to classical vacuum deposition methods including MBE.

It is stressed that the present invention is not only an alternative to the method disclosed in U.S. Pat. No. 4,058,430 for performing ALE growth, but it also gives rise to new advantages as compared to the prior art in general relating to compound thin film growth. These advantages include the ease with which exchange surface reactions can be effected, wherein the elemental components of the compound to be grown are allowed to be brought to the surface reaction area in the form of a second compound of the element in question. This is of particular interest when dealing with metals having low vapor pressures, which thus can be replaced by more volatile compounds such as metal halides or organometals. Accordingly, a decreased source temperature is permitted, as well as a decrease in the substrate temperature needed for a perfect back-evaporation after the formation of a full surface coverage according to the ALE-principle. Concerning the growth of metal oxides, according to present knowledge, a metal halide is chemisorbed onto an oxygen surface in halide molecule form, until the halogen atoms are released in the next surface reaction step by hydrogen atoms from water molecules used as the reactive vapor in the oxidizing surface reaction step.

Another advantage of the exchange reaction can be obtained in the growth rate properties. For example, in the case of direct elemental surface reactions, as in the case of a ZnS growth, the monoatomic metal surface layer has a tendency to re-evaporate before the surface reaction with sulphur vapor. Thus the growth rate is dependent on the re-evaporation time between Zn- and S-surface reaction steps; and, further, it decreases with increasing temperature. In the case of corresponding exchange reactions this drawback does not take place and a constant growth rate of about 0.1 nm/cycle is observed in a wide range of temperatures and re-evaporation times. It has been observed that each compound has its own typical growth rate corresponding to a stable monolayer configuration according to the crystal structure properties in question.

The apparatus according to the present invention is mechanically simpler than that according to the prior art. Important advantages have also been obtained in the operation and maintenance characteristics of such apparatus of present invention. The apparatus is suitable for large area production, due to the effective utilization of the self-stabilizing growth rate property of the ALE process.

The method of the present invention sets certain prerequisites as to the shape of the substrates to be used, due to the necessity of maintaining certain "aerodynamics" in order to obtain fast operation. Ideal substrates are flat plates with smooth surfaces such as glass plates, etc. The operational properties of the ALE-method provides a possibility for tailored layer structures and doping, and such products are easily obtained with the method of the present invention. Reactive vapor in a single surface reaction step may contain several components, which are able to react with the surface to be grown, but it must not contain such components which react with each other resulting in any solid state compound at the temperature of the surface to be grown. For example, a basic ZnS growth can be modified by adding a small amount of $MnCl_2$ vapor to the $ZnCl_2$ reaction steps. $MnCl_2$ and $ZnCl_2$ do not react with each other, but each of them reacts with the solid sulphur surface resulting in Mn doped ZnS. Mixed compounds can be made in the same way, i.e. by adding $CdCl_2$ vapor to the $ZnCl_2$ reaction step in a ZnS growth thus resulting in a $Zn_xCd_{1-x}S$ film. Corresponding doping or mixing is possible with the VI group or any other group elements. A condition for obtaining the ALE-type growth according to the method of the present invention is that simultaneous interactions of such vapors, which are able to react with each other at the temperature of the substrate surface resulting in solid state reaction products at the said temperature, are prevented with the aid of diffusion barriers formed by a gas phase medium or carrier gas. The gas phase medium should be principally inert with respect to the growing surface. Some secondary influences may be, however, included, such as addition of doping agents, catalytic or inhibitory actions and chemical transport of surface reaction residues.

BRIEF DESCRIPTION OF THE DRAWINGS

Preferred embodiments of the invention will be described in conjunction with the accompanying drawings, in which.

DETAILED DESCRIPTION OF THE PREFERRED EMBODIMENTS

Figure 1:
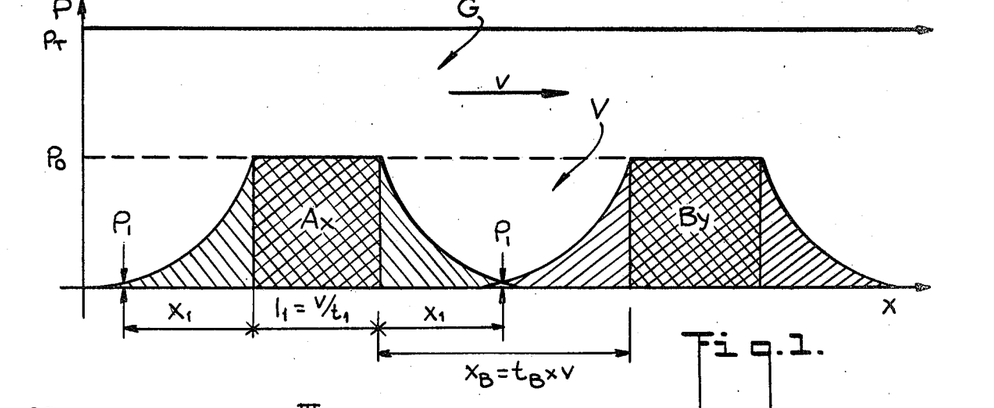
FIG. 1 illustrates pulses of reactive vapors AX and BY and the diffusion barrier V between such pulses.

In accordance with the present invention pulses of different reactive vapors are successively applied to a substrate to cause growth of a compound thin film. For example, as depicted in FIG. 1, such pulses of reactive vapors AX and BY at partial pressures Po, having a diffusion barrier V therebetween, are conducted through the reaction chamber, wherein the length of the diffusion barrier is $X_B$ in the gas phase medium G having a velocity v in the X direction. The quantity $t_B$ represents the time duration of the diffusion barrier, which substantially prevents interaction of the vapor substances, thus precluding any appreciable effect therefrom on the final product.

Figures 2, 3, 4:
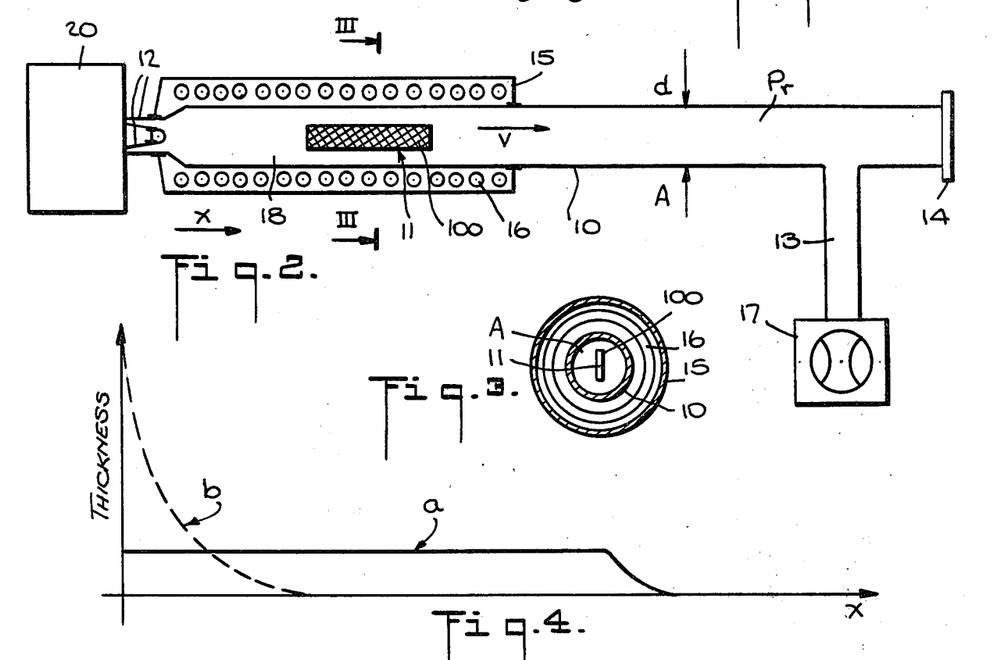
FIG. 2 is a schematic sectional view of an embodiment for carrying out the method of the invention.
FIG. 3 is a transverse section of the structure of FIG. 2 taken along line III—III.
FIG. 4 illustrates the self-stabilizing growth rate effect obtained with the method of the present invention as compared to the prior art.

The embodiment shown in FIGS. 2 and 3 comprises a glass tube 10 as the main body of the structure, source means 20 with connections 12 to the reaction zone 18 in the main body tube, a vacuum pump 17 with an exhaust connection 13 from the main body tube for maintaining a pressure Pr, and a heater 15 surrounding the reaction zone 18. A substrate or substrates 11 are placed in the reaction zone through the opening 14 at the end of the body tube 10. During the growth of the thin films 100 on the substrates, the substrate temperature is maintained with the aid of heater elements 16 controlled by standard regulator means. Reactive vapor pulses from the source means 20 are controlled by a standard timing unit and directed sequentially to the reaction zone according to the ALE-principle and the method of the present invention.

As referred to herein, the present invention provides a self-stabilizing growth rate effect, and a comparison thereof with the prior art is shown in FIG. 4. Curve a illustrates the thickness profile of a thin film grown in accordance with the principles of the present invention, and utilizing the apparatus of FIGS. 2 and 3. On the other hand, a thickness profile b results from the growth of a corresponding thin film effected by means of the prior art where two reactive vapors are caused to react simultaneously with the substrate.

Figure 5:
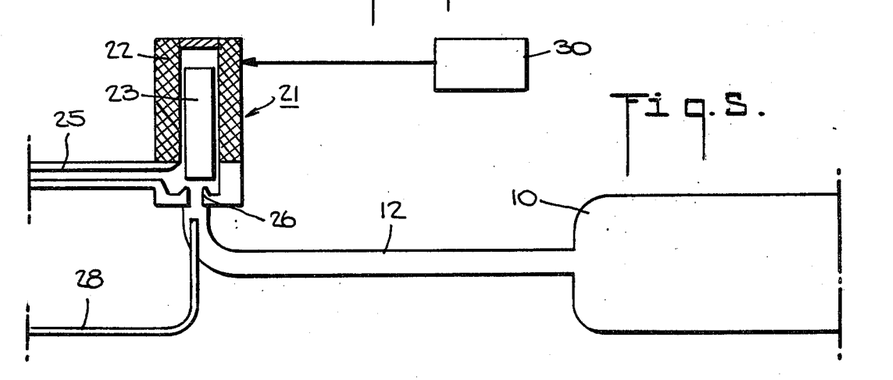
FIG. 5 shows a typical magnetic valve used to produce a reactive vapor pulse source in accordance of the method of the present invention.

Two principal techniques has been used to actuate the pulses of the reactive vapors. One is the use of mechanical valves, constituting a straightforward technique for reactive materials which are effectively volatile at room temperature. This kind of solution is represented in FIG. 5 where reference numeral 25 indicates the connection from the source to the reactive vapor reservoir, reference numeral 21 depicts a valve body having a valve solenoid 22 and a lock element 23, and where the valve opening 26 and a connection to carrier gas supply 28 communicate directly with the source connection tube 12. A carrier gas flow is useful to minimize tail formation to reactive gas pulses in the source connection tube 12. The valve action is controlled by a timing unit 30.

Figure 6:
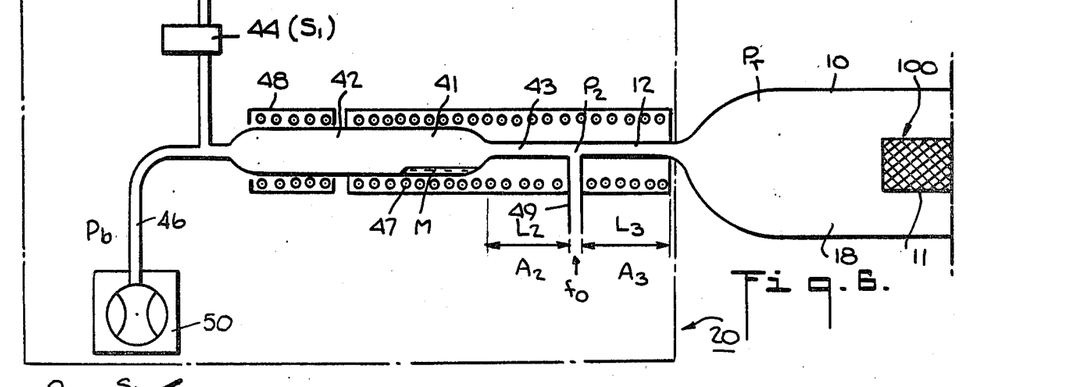
FIG. 6 is a schematic illustration of an embodiment of a source of reactive vapor pulses according to the method of the present invention.

The other approach to the pulse source embodiment is schematically presented in FIG. 6. In this approach the mechanical valve action is replaced by controllable diffusion barriers in the connection tube between the source and the reaction chamber. This type of source is preferable in cases where the reactive material has a low vapor pressure and must therefore be conducted to the reaction chamber at an elevated temperature. The reactive vapor is produced by heating a reactive material M in solid or liquid form in a source region 41 with the aid of a heating element 47. In a lock condition a diffusion barrier is formed in a source opening tube 43 with the aid of the carrier gas supplied from a connection tube 49 and exhausted through a connection tube 46 to an exhaust pump 50. A corresponding diffusion barrier is formed in the source connection tube 12 in order to prevent the vapors in the reaction chamber from diffusing to the source. The conditions needed for such diffusion barriers are described in detail hereinbelow. In the lock condition the reactive vapor produced in the evaporation region 41 is transferred to a condensation region 42, which can be cooled with the aid of a cooling element 48. The lock condition of the source is changed to a feeding condition by controlling a valve 44 to admit an extra carrier gas flow, which is high enough to turn the flow direction in the source opening tube 43. The source operation is described in detail with the aid of the flow circuit analogy presented in FIG. 7.

Figure 10:
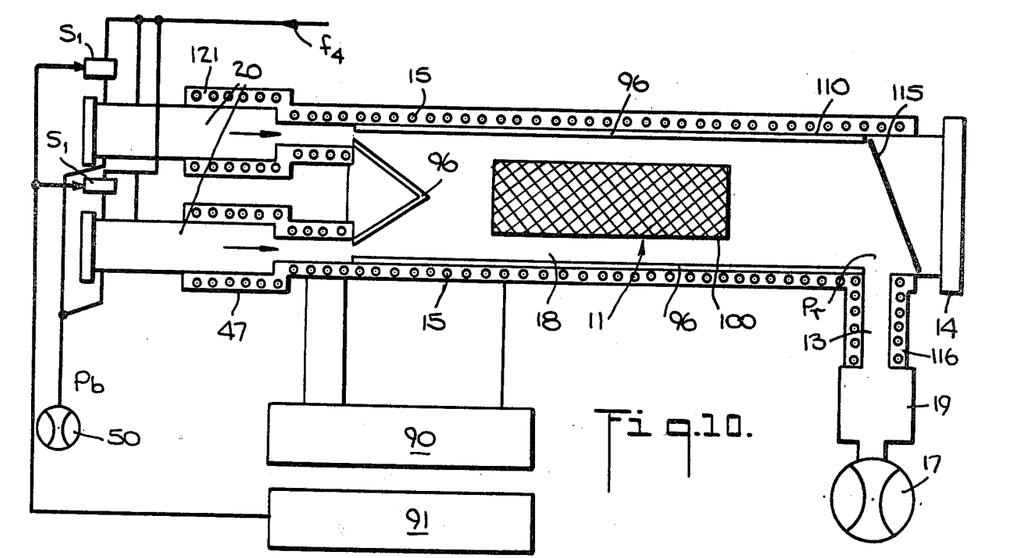
FIG. 10 is a schematic vertical sectional view of an embodiment which is principally compatible with that of FIG. 1.
Figure 11:
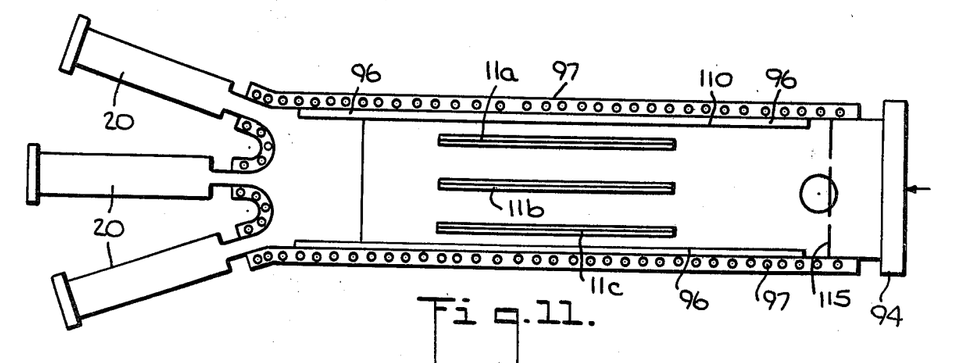
FIG. 11 is a sectional top view of the embodiment of FIG. 10.
Figure 12:
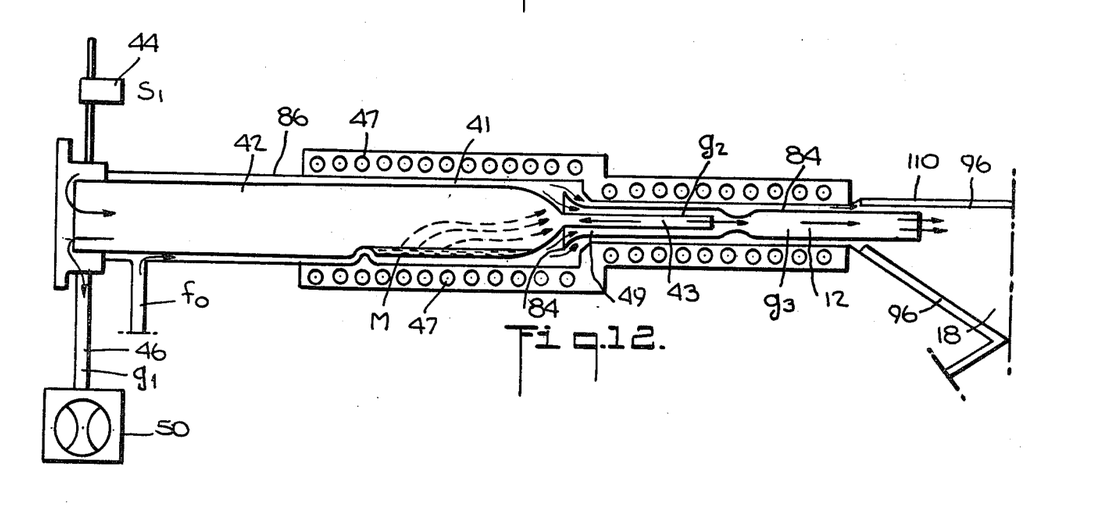
FIG. 12 is a sectional view of the embodiment of the source of FIG. 6 used in the embodiment of FIG. 10.

An embodiment which may be used to demonstrate the method of the present invention by means of the various examples given herein, is illustrated in FIGS. 10 and 11. For its working principle it is identical to the embodiment of FIGS. 2 and 3 and contains a tube-like reaction chamber 18 plus source and exhaust means. The body of the reaction chamber 110 is made of stainless steel which is covered with inner glass plates 96. The exhaust means includes a heating element 116, a condensation region 19, and a gas flow steering wall 115. Temperature regulators and a source pulse timing unit are illustrated respectively by the blocks 90 and 91. FIG. 12 shows the source means applied to the embodiment of FIGS. 10 and 11 in accordance with the principles presented in FIGS. 6 and 7. In this structure the tubes 12, 49 and 43 have been constructed with the aid of a coaxial glass tube array formed by source opening 43 and a glass tube 84. The outer body 86 of the source means is of stainless steel.

A common feature of the embodiments in FIGS. 2 and 3 and FIGS. 10 and 11, is that the substrates are in a fixed place in the reaction chamber during the thin film growth. The reactive vapor pulses pass through the chamber and are driven by a carrier gas which forms diffusion barriers between the pulses of the reactive vapors.

Figures 7, 8, 9A, 9B, 9C:
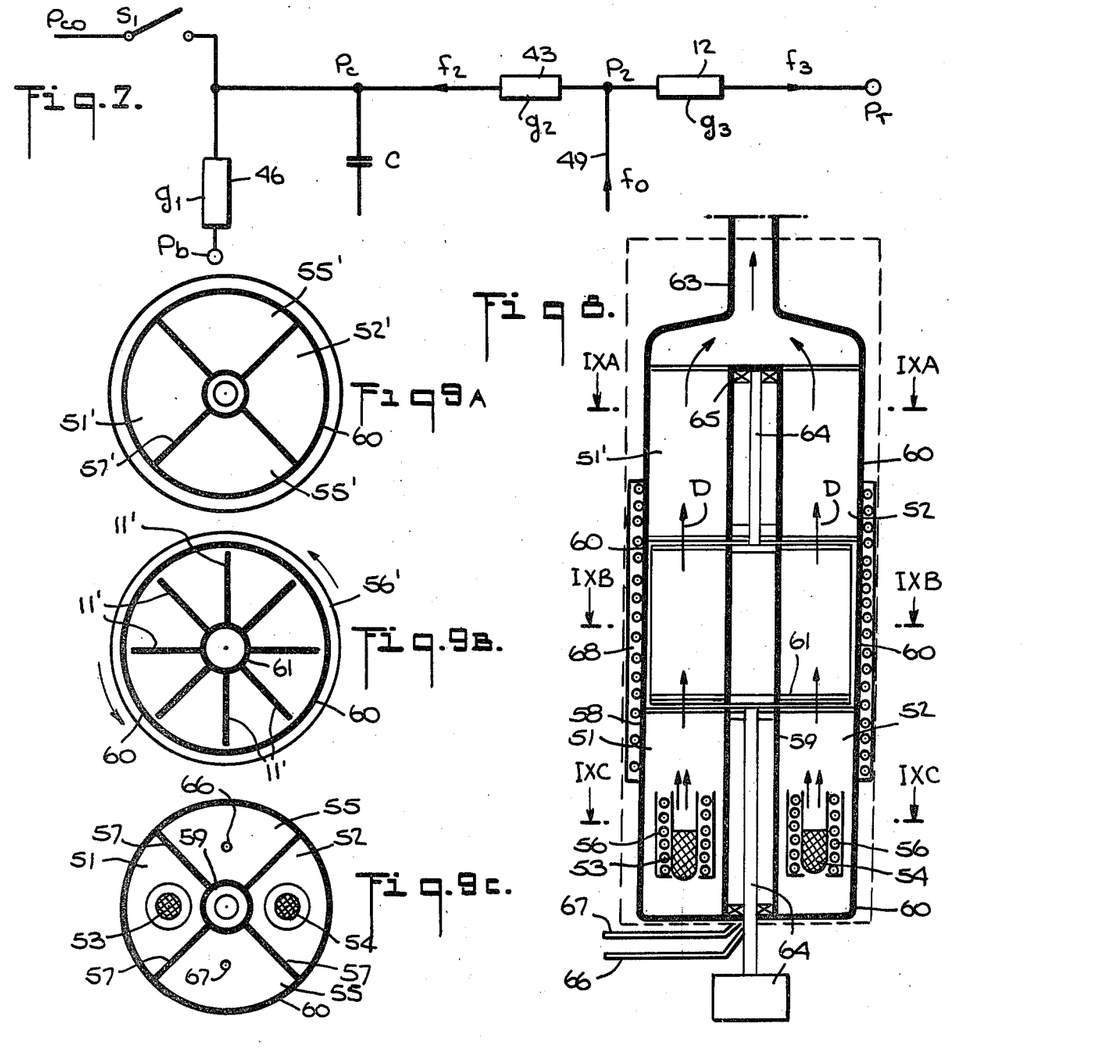
FIG. 7 is a simplified flow circuit constituting an analog of the source embodiment of FIG. 6.
FIG. 8 is a schematic vertical section view of another embodiment of apparatus used to carry out the method of the present invention.
FIGS. 9A-9C are transverse sectional views of FIG. 8, taken along lines IXA—IXA, IXB—IXB, and IXC—IXC, respectively.

Another approach to the method of the present invention comprises the use of embodiments having locally fixed streams of the reactive vapors separated from each others by locally fixed streams of gases forming the diffusion barriers. In such embodiments the cyclic alternative interactions between the substrate surface and each reactive vapor stream in turn is made by rotation or other periodic mechanical movement of the substrates. From the point of view of the substrate surface the situation is quite similar in both cases, wherein the substrate is successively subjected to the interaction of each reactive vapor in a gas phase medium, which keeps said reactive vapors separated by building diffusion barriers between them. Embodiments with locally fixed streams of the reactive vapors are presented in FIGS. 8, 9A, 9B, 9C and FIGS. 13, 14. In the embodiment of FIGS. 8, 9A, 9B and 9C two reactive vapor sources 53 and 54 are placed in opposite columns 51 and 52 of the body 60 of the apparatus. The sources are heated with heaters 56. The reactive vapors flow up by diffusion or with the aid of carrier gases and meet the substrates 11, which are placed in a rotating holder 61 forming a structure resembling a paddle wheel. When the "paddle wheel" is rotating, the substrates will meet each reacting vapor stream in turn when passing the columns 51 and 52, respectively. Carrier gas streams from tubes 66 and 67 in columns 55 sweep up the reactive vapors between the substrates while they are passing the columns 55. In the channels between the substrates the flow conditions are nearly identical with those in the embodiment of FIGS. 10 and 11. In FIG. 8, reference numeral 64 indicates the means for substrate rotation, while a heater 68 is provided at the reaction zone, and walls 57 are provided between the vertical flow columns, 51', 52', 55' and 57' in FIG. 9A correspond to 51, 52, 55 and 57 in FIG. 9C, respectively.

Figure 13:
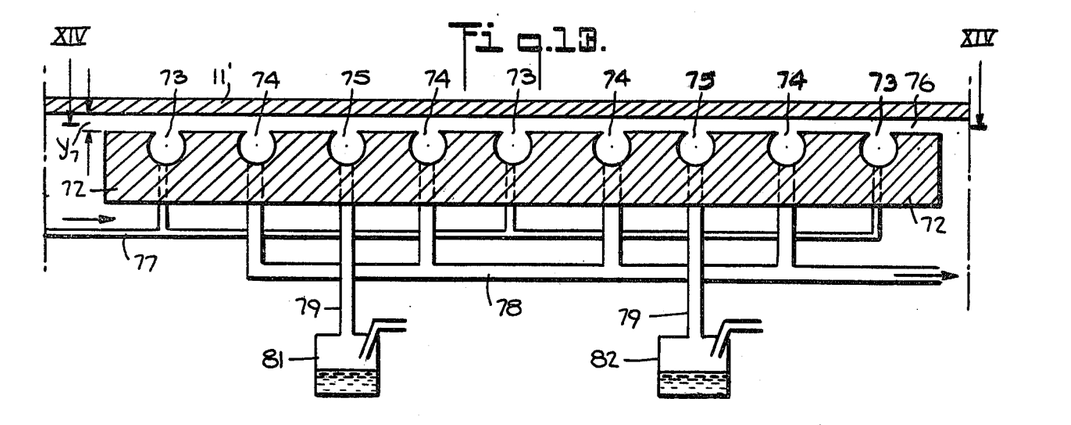
FIG. 13 is a schematic illustration of another embodiment of apparatus used to carry out the method of the present invention, and is a vertical sectional view taken along line XIII—XIII of FIG. 14.
Figure 14:
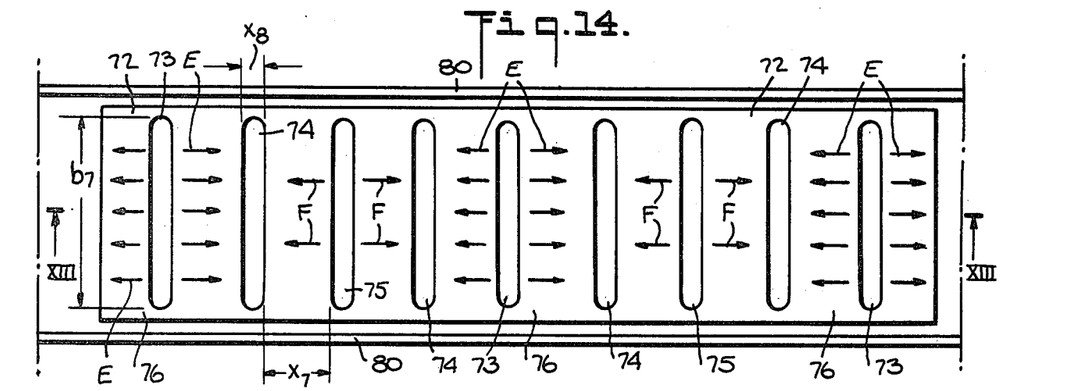
FIG. 14 is a schematic horizontal sectional view of the embodiment of FIG. 13 taken along line XIV—XIV.

In the embodiment of FIGS. 13 and 14 the sequential interactions between the substrate surface and the reactive vapors are made by a reciprocating motion of the substrate 11' over a fixed array of source openings 75, carrier openings 73 and exhausts 74. Diffusion barriers E are formed between the substrate surface and the gas flow array body 72. In accordance with calculations as set forth below, operation with this embodiment is possible even at atmospheric pressure without an unpractically high total flow rate of the carrier gas. In FIGS. 13 and 14, element 77 is the carrier gas feed tube, 79 the source connections, 78 the exhaust and 81, 82 the reactive vapor sources.

Because an ALE-type process generally consists of thousands of single surface reaction steps in a thin film growth, the total process time $t_p$ tends to become long unless special attention is paid to minimize the contributing delays in the reaction cycles. Generally a figure of merit E of a thin film process can be given by the formula $$E = T \cdot A_s/(t_p + t_L), \quad (1)$$

where T is the film thickness, $A_s$ the substrate area to be covered, $t_p$ the process time and $t_L$ the time for loading and unloading the apparatus. The apparatus cost, power consumption and source material efficiency are not considered in this comparison.

In an ALE-type process the thickness of the thin film can be expressed in form $$T = N \cdot T_o, \quad (2)$$

where $T_o$ is the thickness obtained in one reaction cycle and N the number of cycles. The process time, $t_p$, can be expressed by $$t_p = N \cdot t_o, \quad (3)$$

where the time of one cycle, $t_o$, is the sum of pulse times of different reactive vapors $t_1, t_2, \ldots, t_m$ and the time intervals $t_{i1}, t_{i2}, \ldots, t_{im}$ between them needed to build up the diffusion barriers. In the case of a simple binary compound AB, $t_o$ has the form $$t_o = t_A + T_{iA} + t_B + t_{iB}. \quad (4)$$

The substrate area $A_s$ handled in a process is mainly determined by the equipment size and can be varied in wide limits within the embodiments of this invention. The operational analysis, which also includes the effect of the size of the apparatus, is practically made by analyzing the time contributions $t_m$ and $t_{im}$ in a reaction cycle. A detailed analysis is made for the case of the embodiments in FIGS. 2, 3, 10, 11, where there is a carrier gas flow at a velocity v in a tube-like reaction chamber, with a free sectional area A according to FIG. 1, where the total pressure $p_r$ and a partial pressure $p_o$ of the reactive vapor pulses AX and BY are propagated with the carrier gas flow in the x-direction.

The reactive vapor pulses tend to broaden during the propagation due to diffusion in the carrier gas according to equation $$(\delta p/\delta t) = D\nabla^2 p, \quad (5)$$

where D is the diffusion constant of the reactive vapor in the carrier gas. In laminar flow conditions in the reaction tube, and neglecting the effects of radial velocity profiles, eq. (5) can be replaced by a one-dimensional diffusion equation in the x-direction $$(\delta p/\delta t) = D(d^2p/dx^2). \quad (6)$$

For simplicity the pressure $P_o$ at the pulse edges is assumed to be constant during the diffusion which results in a boundary condition, and this assumption is also valid for consideration of the diffusion barrier in locally fixed cases such as in the source means of FIGS. 6 and 7 and in the embodiment of FIGS. 13 and 14. The solution of (6) is thus $$p(x,t) = p_o\, erfc\, (x/2\sqrt{Dt}\,), \quad (7)$$

where x expresses the distance from pulse edges, and t is the time from pulse injection. An isobar of pressure p1 propagates from the pulse edges according to $$x = 2\, C_1 \sqrt{Dt}\,, \quad (8)$$

wherein $C_1$ means $$erfc\, C_1 = p_l/p_o. \quad (9)$$

A diffusion barrier V, which is able to decrease the partial pressures of AX and BY to a value P1, has a length $X_B$ according to eq. (8) and FIG. 1

$$X_B = 2 \cdot X_{p1} = 4 \cdot C_1 \sqrt{Dt}\,. \quad (10)$$

At a carrier gas velocity v the length of the diffusion barrier $X_B$ at a distance L from the injection point of the reactive vapor pulses can be expressed in the form $$X_B = 4 \cdot C_1 \sqrt{DL/v}\,, \quad (11)$$

which corresponds to the interval between the reactive pulses $t_B$ as $$t_B = x_B/v = 4\, C_1 \sqrt{DL/v^3}\,. \quad (12)$$

For practical expressions it is useful to give the diffusion constant D in form $$D = D^x/p, \quad (13)$$

where the constant $D^x$ is independent of the pressure of the diffusion medium. Thus $t_B$ can be given in form $$t_B = 4\, C_1 \sqrt{D^x}\, \sqrt{L/v^3 p}\,. \quad (14)$$

According to (14) $t_B$ is strongly dependent on the carrier gas velocity v, which can also be expressed in the form $$v = S/A, \quad (15)$$

where S is the pumping speed and A is the free sectional area of the reaction tube. A minimum carrier gas quantity for a certain value of $t_B$ leads to high quantity at a low pressure, which cannot, however, go below $p_o$.

The pressure limits for the partial pressure of the reactive vapors, Po, can be derived from the total atom or molecule dose needed for a full coverage of the substrate surfaces. According to the kinetic gas theory and the propagation geometry in question, the number of reactive gas molecules in a pulse can be expressed in the form $$n_2 = v \cdot t_1 \cdot p_o \cdot A/kT, \quad (16)$$

where $t_1$ is the duration of the reactive pulse. If the number of atoms needed to form a full surface coverage on a surface area unit is $N_s$, and the efficiency of the reactive vapor utilization is $\eta$, the number of molecules needed in a reactive vapor pulse is given by $$n_1 = N_s A_s/\eta, \quad (17)$$

where $A_s$ is the substrate area. By making $n_1 = n_2$ we have $$Po = \frac{N_s \cdot A_s \cdot kT}{v \cdot t_1 \cdot A \cdot \eta}. \quad (18)$$

Equation (18) gives, on the other hand, the pulse duration $t_1$ for a given $p_o$. It can be found that for minimum $t_1$ the value of $p_o$ is increased. An upper limit to $p_o$ is set by the pressure of the carrier gas which was found to be advantageous for a minimized optimal flow level, $p_r \cdot v$, and $t_o$ conditions. A low flow level is still useful for minimum radial profiles of the reactive vapor pressure $p_o$. For a simple binary compound AB growth from reactive vapors AX and BY, the minimum time of a process period $t_p$ is $$t_p = 2(t_D + t_1), \quad (19)$$

by making $t_A = t_B = t_1$ and $t_{iA} = t_{iB} = t_D$.

In the embodiments of the present invention practical orders of magnitudes for $t_D$ and $t_1$ are 0.1 ... 1 and 0.05 ... 0.5 s, respectively, at a total pressure $p_r$ 0.5 ... 5 mb. As a subsequent check for the one-dimensional diffusion analysis we can note that, typically, both the pulse lengths $l_1$ ($=v/t_1$) and the lengths of the diffusion barriers $X_D$'s are greater than the diameters of the reaction tubes, which situation can be considered as a criterion for the one-dimensional approach. In the analysis above, abrupt edges of the reactive vapor pulses were assumed at the injection point. According to the source means of FIG. 5 this is easily achieved with standard valves. In the case of source means according to FIGS. 6 and 7 a detailed analysis is necessary to ensure the intended situation. A lock condition of the source is achieved when diffusion barriers are formed in the tubes 43 and 12. Conditions for such diffusion barriers can be derived for the flow levels $f_2$ and $f_3$ in those tubes by differentiating eq. (8), which gives the velocity $v_d$ of an isobar in the carrier gas $$v_d = \frac{dx}{dt} = C_1 \sqrt{D}/\sqrt{t} = 2C_1^2 D/x = 2C_1^2 D^x/xp. \quad (20)$$

A diffusion barrier is built up by a flow level $f_d$, which gives a velocity $v_f \geq v_d$ of the carrier gas in a channel with a sectional area $A_f$ $$v_f = f_d/A_f p 2 C_1^2 D^x/xp. \quad (21)$$

Then $$f_d \geq 2 A_f C_1^2 D^x/x \quad (22)$$

In the flow circuit analogy of FIG. 7, the diffusion barrier conditions in channels 43 and 12 can be given by $$f_{d2} \geq 2 A_2 C_1^2 D^x/L_2, \text{ and} \quad (23)$$

$$f_{d3} \geq 2 A_3 C_1^2 D^x/L_3, \quad (24)$$

where $A_2$ and $A_3$ are the sectional areas and $L_2$ and $L_3$ the lengths of the channels 43 and 12 respectively.

The pulse injection condition is obtained by letting a carrier flow through the valve $S_1$. The rise time of the source injection is easily minimized in comparison to $t_B$ and $t_1$, but certain attention must be paid to the values of source volume C and the conductance $g_1$, $g_2$ and $g_3$, in order to ensure a short delay at the switch off point. In general terms, a gas flow level f, through a channel, can be expressed in the form $$f = g(p_a^2 - p_b^2), \quad (25)$$

where $p_a$ and $p_b$ are the pressures at the end of the channel, and g is a constant depending on the geometry of the channel and the properties of the gas in question. With the aid of eq. (25) and the circuit analogy of FIG. 7, a solution is obtained to the source pressure $p_c$ as a function of time from the switch off point of $S_1$, wherein $$p_c = \frac{a \cdot e^{t/\tau} + 1}{a \cdot e^{t/\tau} - 1} \cdot p_{c\infty}, \quad (26)$$

where $p_{co}$ is the source pressure at t=o and $$a = (1 + p_{c\infty}/p_{co})/(1 - p_{c\infty}/p_{co}), \quad (27)$$

$$p_{c\infty} = \sqrt{(g^* p^{*2} + g_1 p_1^2)/(g^* + g_1)}, \quad (28)$$

$$= C/2g^* p_{c\infty}, \quad (29)$$

$$g^* = g_2/(1 + g_2/g_3), \text{ and} \quad (30)$$

$$p^* = \sqrt{p_r^2 + f_o/g_3} \quad (31)$$

The pressure $p_2$ (FIG. 7) has a value $$p_2^2 = (f_o + g_2 p_c^2 + g_3 p_r^2)/(g_2 + g_3). \quad (32)$$

A diffusion barrier in 43 is obtained by setting $f_2 = f_{d2}$ $$f_2 = g_2(p_2^2 - p_c^2), \quad (33)$$

-continued
$$= g_2(f_o + g_3(p_r^2 - p_c^2))/g_2 + g_3) \geq f_{d2}. \quad (34)$$

The build-up time $t_s$ of the diffusion barrier, which is equal to the source pulse delay can be solved from (34) and (26), which give $$t_s \geq \ln\frac{1}{a}\left(\frac{b+1}{b-1}\right), \quad (35)$$

where $$b = \sqrt{(f_o + g_3 p_r^2 - f_{d2}(g_2 + g_3)/g_2)/g_3/p_{c\infty}}. \quad (36)$$

A safety limit to the minimum time interval $t_1$ between two reactive pulses can be achieved by adding the pulse delay $t_s$ to the time $t_B$.

The analysis made for the conditions of diffusion barriers in a gas phase medium are utilized for the embodiments of FIGS. 2 and 3 and FIGS. 10 and 11. The analysis is also directly applicable to the case of FIGS. 8 and 9 and easily modified to the case of FIGS. 13 and 14.

EXAMPLES

The following examples are given to further illustrate the present invention. The scope of the invention and the field of its application are not, however, limited by these examples.

EXAMPLE 1

The choices of structural and operational parameters for an embodiment of FIGS. 10 and 11 are as follows:
Reaction zone:
length, L=40 cm;
sectional area of the body, $A_R = 14 \times 14$ cm$^2$;
free sectional flow area, A=150 cm$^2$;
exhaust pump speed, S=60 m$^3$/h.
Source means, FIG. 12:
source volume (41+42), C 210 cm$^3$;
source opening (43), $\phi 0.7 \times 10$ cm; $g_2 = 1400$ cm$^3$/mbs;
source connection (12), $\phi 1.1 \times 10$ cm; $g_3 = 8800$ cm$^3$/mbs;
exhaust connection (46), $g_1 = 100$ cm$^3$/mbs.
Operational parameters (typically)
reaction zone pressure, $p_r = 2$ mb;
source exhaust pump pressure, $p_b = 0.4$ mb;
gas phase medium (argon) flow/source, $f_o = 5500$ mbcm$^3$/s;
pulse pressure in source, $p_{co} = 3$ mb.
Using the given parameters the following values can be calculated.
Equation (30): $g^x = 1208$ cm$^3$/mbs;
Equation (28): $p_{c\infty} = 2.07$ mb;
Equation (36): b=1.067;
Equation (22): $f_{d2} = 89$ mbcm$^3$/s corresponding to ppm isobar, $p_1/p_o = 10^{-6}$ in the center of the diffusion barrier;
Equation (29): $\tau = 0.030$ s;
Equation (35): $t_s = 0.05$ s;
Equation (14): $t_B = 0.74$ s.
A safety time interval between pulses is thus about $t_1 = 0.8$ s. In practice a value $t_i = 1$ s has been used.

EXAMPLE 2

Preparation of a $Ta_2O_5$ compound thin film according to the parameters defined by example 1.
Substrates: 6 pieces $0.3 \times 10 \times 20$ cm flat glasses.
Temperature of the reaction zone $T_R = 300°$ C.
Vapor substances:
$TaCl_5$ from source, FIG. 12, at a temperature of 140° C., $t_1(TaCl_5) = 0.2$ s;
$H_2O$ from source means of FIG. 5, $t_1 (H_2O) = 0.2$ s, $T(H_2O) = 15°$ C.
A growth of 2500 cycles gives a $Ta_2O_5$ thin film of 1000 Å on the substrates.

EXAMPLE 3

Preparation of ZnS thin films doped with manganese, Mn. Embodiment according to example 1.
Substrates as in example 2 or preferably Corning Glass 7059.
Reactive zone temperature 450° C.
Reactive vapor substances: $ZnCl_2$ and $MnCl_2$ from sources of FIG. 12 at 380° C. and 510° C. respectively. Source pulses of $ZnCl_2$ and $MnCl_2$ are given simultaneously with $t_1 = 0.2$ s. Sulfidating agent $H_2S$ is given from source means of FIG. 5, $t_1(H_2S) = 0.2$ s.
A growth of 4500 cycles gives a ZnS (Mn) film of 4000 Å on the substrates.

EXAMPLE 4

Figure 15:
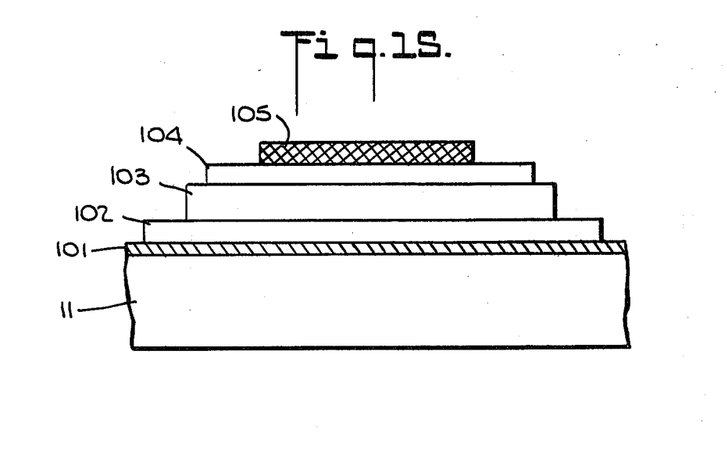
FIG. 15 is a schematic illustration of an electroluminescence (EL) thin film structure produced with the aid of the present invention according to example 4.
Figure 16:
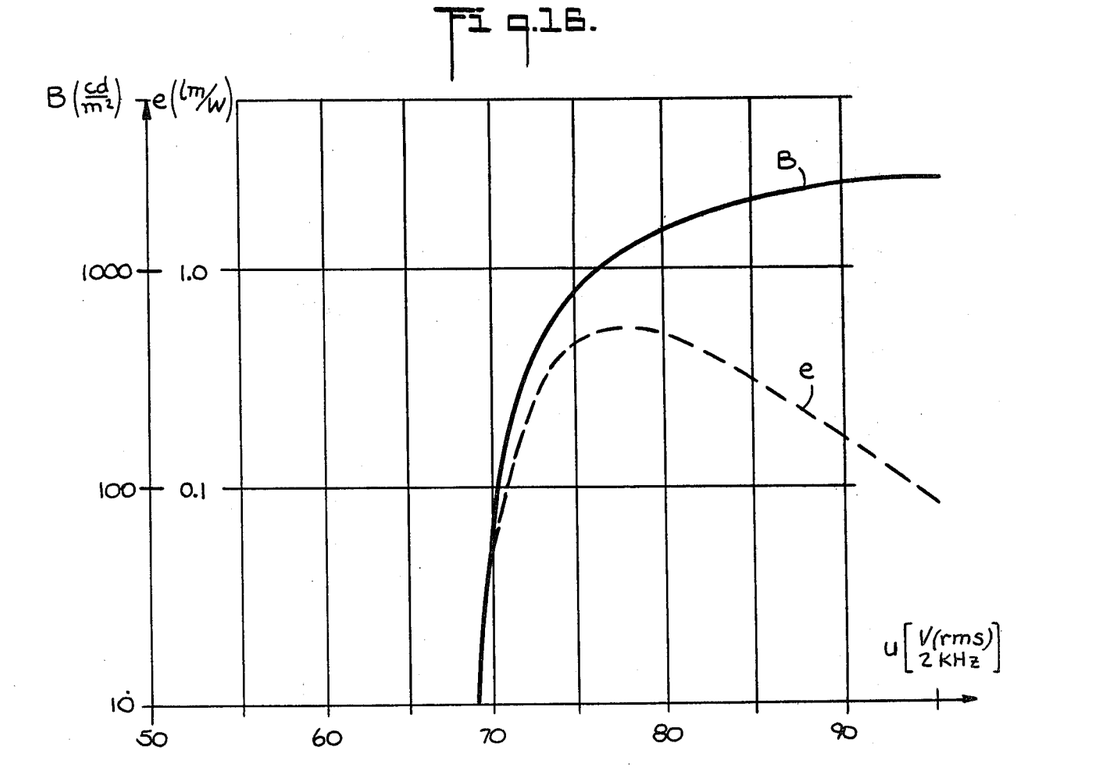
FIG. 16 illustrates measured brightness and efficiency curves for the EL-structure of FIG. 15.

Thin films of $Ta_2O_5 + ZnS(Mn) + Ta_2O_5$ are prepared, according to examples 2 and 3, on glass substrates covered by a thin film of conducting transparent indium-tinoxide, and the thin film is covered with a contact electrode of aluminum to provide an electroluminence structure as illustrated in FIG. 15. In FIG. 15, the substrate 11 is covered with a transparent conducting layer of indium-tinoxide, 101, which in turn is covered by a first insulating film 102 of $Ta_2O_5$, a ZnS(Mn) film 103, a second insulating film 104 of $Ta_2O_5$, and an aluminum electrode 105 which enables application of an electric field across the sandwich structure between 101 and 105. With a sine wave excitation of 2 kHz, the brightness and efficiency characteristics of the structure are illustrated in FIG. 16. The curve B indicates the brightness in $cd/m^2$ against the excitation voltage, and the Curve C the efficiency of light output in lm/W.

EXAMPLE 5

Figure 17:
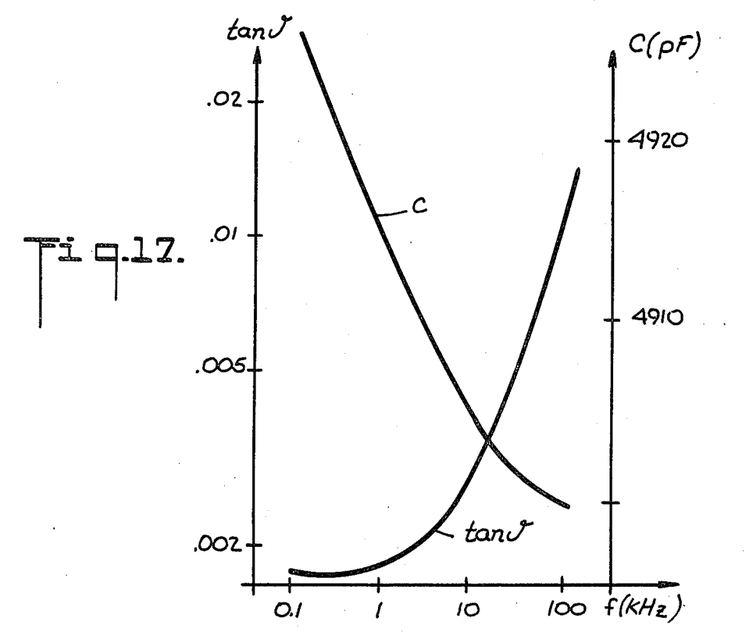
FIG. 17 shows measured electrical properties of an $Al_2O_3$ thin film prepared according to example 5.

Preparation of an $Al_2O_3$ thin film. The process used is similar to that of the example 2, with the $TaCl_5$ replaced by $AlCl_3$ at a temperature of 95° C. A process of 2800 cycles gives a $Al_2O_3$ thin film of thickness 2200 Å at the reaction zone temperature of 250° C. The electrical characteristics of the aluminum oxide film obtained was measured in a sandwich structure where the $Al_2O_3$ film forms an insulator of a plate capacitor between aluminum thin film electrodes, with an active area of $5 \times 5$ mm. In FIG. 17 the curve C is the measured capacitance in pF as a function of frequency, and the curve tan $\zeta$ indicates the dielectric losses.

What is claimed is:

1. A method of growing a compound thin film of different elements on a substrate surface by providing alternate surface reactions, in a single chamber, of different substances respectively containing said different elements, comprising the steps of supplying vapors of said substances repeatedly and alternately to a chamber housing said substrate, supplying a gas phase medium to said chamber at least during periods between the alternate supply of said substances, wherein said vapors react with the surfaces of the substrate to produce a film, said vapors alternately and subsequently reacting with the film to cause said film to grow to provide a solid state product at the temperature of said substrate surface, and wherein the supply of said gas phase medium alternately voids the chamber of each of said substances thereby substantially preventing a simultaneous interaction of said alternately supplied vapors during the growth of said compound thin film on said substrate.

2. A method of growing a compound thin film as set forth in claim 1, wherein said steps of supplying alternate vapors are provided by
   (a) supplying first and second vapors which react with said surfaces to provide said solid state product and by alternately
   (b) supplying a third vapor which reacts with said surfaces to provide said solid state product.

3. A method of growing a compound thin film as set forth in claim 1, wherein said gas phase medium is supplied continuously.

4. A method of growing a compound thin film as set forth in claim 1, wherein said step of supplying said gas phase medium is performed to carry residual vapor products from the chamber to an exhaust condensation zone, and to provide a diffusion barrier between the chamber and the exhaust condensation zone to prevent the flow of vapors from the condensation zone to the chamber.

5. A method of growing a compound thin film as set forth in claim 1, wherein said vapors are supplied from vapor source outputs coupled to the chamber, and wherein said step of supplying a gas phase medium is performed to selectively and alternately provide diffusion barriers at said vapor source outputs.

* * * * *

UNITED STATES PATENT AND TRADEMARK OFFICE
CERTIFICATE OF CORRECTION

PATENT NO. : 4,413,022
DATED : November 1, 1983
INVENTOR(S) : TUOMO S. SUNTOLA, ET AL.

It is certified that error appears in the above-identified patent and that said Letters Patent is hereby corrected as shown below:

On the cover sheet of the patent please change the identity of the Assignee to read --Oy Lohja AB, Espoo, Finland--.

COLUMN 7

Line 63, the exponent "x" should read --*--.

COLUMNS 7 AND 9

In equations 13, 21, 22, 23 and 24, the exponent "x" should read --*--.

COLUMN 10

Line 22, "are" should read --may be--.

Signed and Sealed this

Sixteenth Day of April 1985

[SEAL]

Attest:

DONALD J. QUIGG

Attesting Officer     Acting Commissioner of Patents and Trademarks